(12) United States Patent
Hara et al.

(10) Patent No.: US 6,319,642 B1
(45) Date of Patent: *Nov. 20, 2001

(54) ELECTRON BEAM EXPOSURE APPARATUS

(75) Inventors: Shigehiro Hara; Eiji Murakami; Hitoshi Higurashi; Toshio Yamaguchi, all of Kanagawa-ken; Kazuto Matsuki, Tokyo; Souji Koikari; Shuichi Tamamushi, both of Kanagawa-ken; Kazuyuki Okuzono, Shizuoka-ken, all of (JP)

(73) Assignee: Kabushiki Kaisha Toshiba, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/275,186

(22) Filed: Mar. 23, 1999

(30) Foreign Application Priority Data

Mar. 23, 1998 (JP) .................................................. 10-073888

(51) Int. Cl.$^7$ ........................................................ G03F 9/00
(52) U.S. Cl. .............................................. 430/30; 430/296
(58) Field of Search .................................. 430/5, 30, 296, 430/311, 22

(56) References Cited

U.S. PATENT DOCUMENTS 5,885,747 * 3/1999 Yamasaki et al. ................... 430/296
5,894,057 * 4/1999 Yamaguchi et al. .................. 430/30

FOREIGN PATENT DOCUMENTS 3-219617  9/1991  (JP) .
5-234863  9/1993  (JP) .
10-32188  2/1998  (JP) .

* cited by examiner

Primary Examiner—Mark F. Huff
Assistant Examiner—Saleha R. Mohamedulla
(74) Attorney, Agent, or Firm—Foley & Lardner

(57) ABSTRACT

A pattern lithography system for lithographing a pattern with reference to a pattern data by deflecting an electron beam includes a controller, an extracting unit, a dividing unit, and an expansion unit. The controller analyzes the pattern data and determines stripes of the pattern to be successively lithographed. The extracting unit extracts parts of the pattern data corresponding to stripes of the pattern in response to commands from the controller and sends the data to the dividing unit. The dividing unit divides the part of the pattern data into a plurality of sub-patterns. The sub-patterns are sized smaller than a minimum deflection range of the electron beam. The expanding unit expands the sub-patterns in accordance with a command from the controller to produce stripe data for driving a lithographing unit to lithograph the stripe. Stripes may have at least one sub-pattern in common such that multiple lithography is performed.

6 Claims, 13 Drawing Sheets

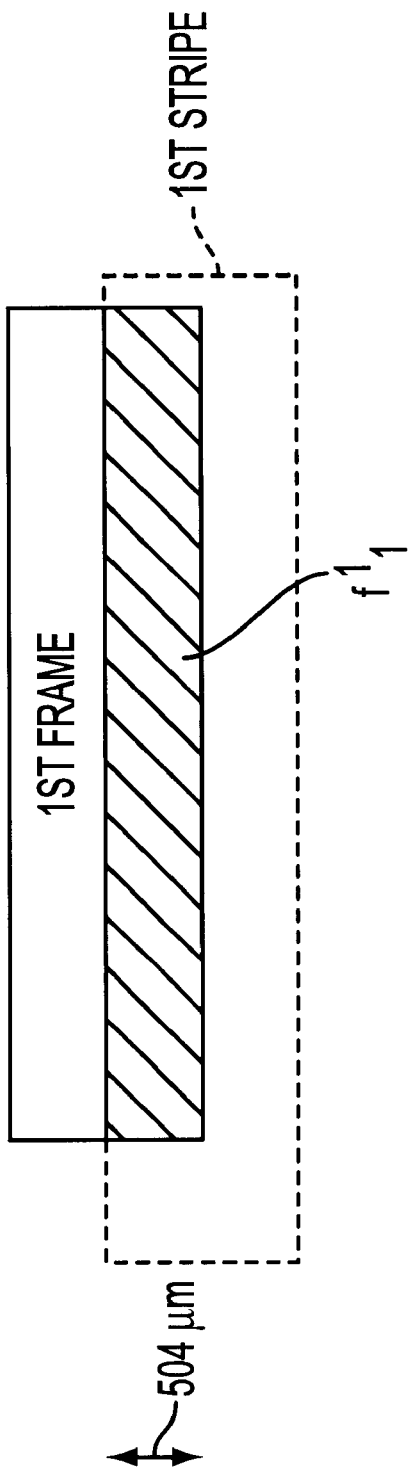
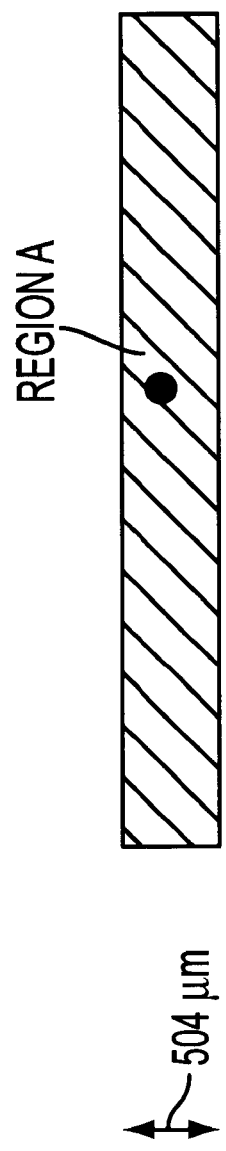

ELECTRON BEAM EXPOSURE APPARATUS

BACKGROUND

This invention relates to a pattern lithography system for fabrication of a mask, a wafer or the like for production of semiconductor devices, and more particularly to a pattern lithography system having the capability of shifting a deflection boundary or varying a field size.

In recent years, pattern lithography systems using an electron beam have been used to form semiconductor integrated circuit patterns on a resist coated on a semiconductor substrate such as a mask, a wafer or the like. The lithography system deflects the electron beam by an electromagnetic means so as to irradiate the electron beam onto a desired position on the semiconductor substrate. In the case where the deflection is carried out in a wide area, an error due to aberration or the like increases so as to produce a deflection distortion in the lithographed pattern. Therefore, the size of the area in which the deflection can be carried out is often limited to about several millimeters so that accuracy on the deflection boundary or pattern position accuracy is less than an allowed value.

Further, in order to realize this kind of system capable of lithographing the pattern with high precision and high throughput, a multiple stage deflector such as a two-stage deflector having a main and an auxiliary deflector, or a three-stage deflector having a main, an auxiliary and a sub-auxiliary deflector, has been widely used. Generally, because the semiconductor integrated circuit is so large that it cannot be set within the deflection area of the pattern lithography system, an entire circuit pattern is divided into a plurality of areas capable of being deflected and the entire circuit pattern is lithographed by separately lithographing each area respectively.

On the other hand, in recent years, because the semiconductor integrated circuit has been becoming smaller, a method for higher precision in pattern lithography has been demanded. As one of the methods for realizing such a high precision pattern lithography, so-called 'multiple lithography' has been recently proposed. By lithographing the same area in a pattern repeatedly, accuracy on the deflection boundary and pattern position accuracy which cannot be improved even if the deflection area is contained within a certain size can be improved through an averaging effect.

However, according to this method, a plurality of overlapped lithography data each having a shifted deflection boundary must be prepared. Therefore, problems which increase both a data conversion time and a data amount for pattern lithography are inevitable. Generally, it takes an extremely large calculation time to convert the pattern data for a semiconductor circuit produced by CAD (Computer-Aided Design) or the like to data which can be input to the pattern lithography system. By producing data for n overlapping areas, for example, the calculation time required for this data conversion increases by n times as well as the data amount for pattern lithography.

In recent years, the scale of the semiconductor integrated circuit has become larger and larger, and the data amount for pattern lithography increases in a straight line with this growth. Further, the development and production of logic semiconductor circuits that include a memory circuit, and a new technique called 'photo proximity effect correction' proposed recently, have further accelerated the increase of the data amount required for pattern lithography.

Generally, enlargements of a data processing computer and a recording medium such as a magnetic recording apparatus are necessary due to an increase of the lithography data amount. These enlargements further increase a data processing time, a data I/O amount, a lithography data transportation time through network and the like as well as an investment for semiconductor production. These reduce productivity of the semiconductor production. All prior art systems to date have required the preparation and storage in the lithography system of all lithography data for an entire wafer before the lithography process can begin. Therefore, the increase of the lithography data amount leads to an increase of production cost for the semiconductor integrated circuit. In the case when the lithography data amount increases greatly, the pattern lithography itself may be almost impossible because there is not sufficient memory space to store the lithography data in the recording medium or pattern memory of the pattern lithography system. Therefore, compression of the lithography data amount is one of the most important problems for production of the semiconductor integrated circuit.

As described above, in the case where multiple lithography is carried out with a shifted deflection boundary, the lithography data amount is greatly increased. Such an increase of the lithography data amount then requires enlargement of the data processing computer and the recording medium, thereby leading to an increase of the data processing time, the lithography data transportation time and the like as well as the investment for semiconductor production. Ultimately, the productivity of semiconductor production drops, thereby leading to a rise of production cost on the semiconductor integrated circuit.

The above problems also exist in not only pattern lithography systems that use an electron beam, but also in systems that use an ion beam or a laser beam.

SUMMARY OF THE INVENTION

The present invention has been made in view of the above-mentioned circumstances and is intended to solve the above-mentioned problems. In particular, a purpose of the present invention is to provide a pattern lithography system capable of carrying out multiple lithography with a shifted deflection boundary without suffering from the above-mentioned problems relating to the increases in the lithography data amount.

In order to solve the above-mentioned problems, the present invention provides a pattern lithography system for lithographing a pattern with reference to a pattern data by deflecting a beam. A controller analyzes the pattern data to determine stripes of the pattern to be successively lithographed. An extracting unit extracts parts of the pattern data corresponding to the successive stripes in accordance with successive commands from the controller specifying regions of the pattern that correspond to the successive stripes. A dividing unit divides extracted parts of the pattern data provided by the extracting unit into sub-patterns whose size is smaller than a minimum deflection range of the beam. A memory device stores sub-patterns produced by the dividing unit. An expanding unit expands sub-patterns stored in the memory device to produce lithography data for driving a lithographing unit in accordance with successive commands from the controller specifying stripes to be successively lithographed.

The present invention further provides a method for lithographing a pattern represented by pattern data. The pattern data is analyzed to determine stripes of the pattern to be successively lithographed. Then, for each stripe, data for a region of the pattern corresponding to the stripe is successively extracted from the pattern data and divided into sub-patterns whose size is smaller than a minimum deflection range of the beam. Sub-patterns of the extracted part are then expanded to produce lithography data for driving a lithographing unit to lithograph the stripe.

The present invention further provides an alternative method for lithographing a pattern represented by pattern data. The pattern data is analyzed to determine overlapping stripes of the pattern to be successively lithographed. Then for each stripe, data for the region of the pattern corresponding to the stripe for which sub-pattern data is not already stored is extracted and divided into sub-patterns whose size is smaller than a minimum deflection range of the beam and storing the divided data. The sub-patterns are stored and then stored sub-patterns are expanded to produce lithography data for driving a lithographing unit to lithograph the stripe.

Additional embodiments and features of the invention are described in the following detailed description of the invention and in the appended claims.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 5 is a diagram showing a relation between a first frame and a first stripe;

DESCRIPTION OF THE PREFERRED EMBODIMENTS

Embodiments of a pattern lithography system of the present invention will now be specifically described in more detail with reference to the accompanying drawings. Wherever possible, the same reference numbers are used throughout the drawings to refer to the same or like parts.

Figure 1:
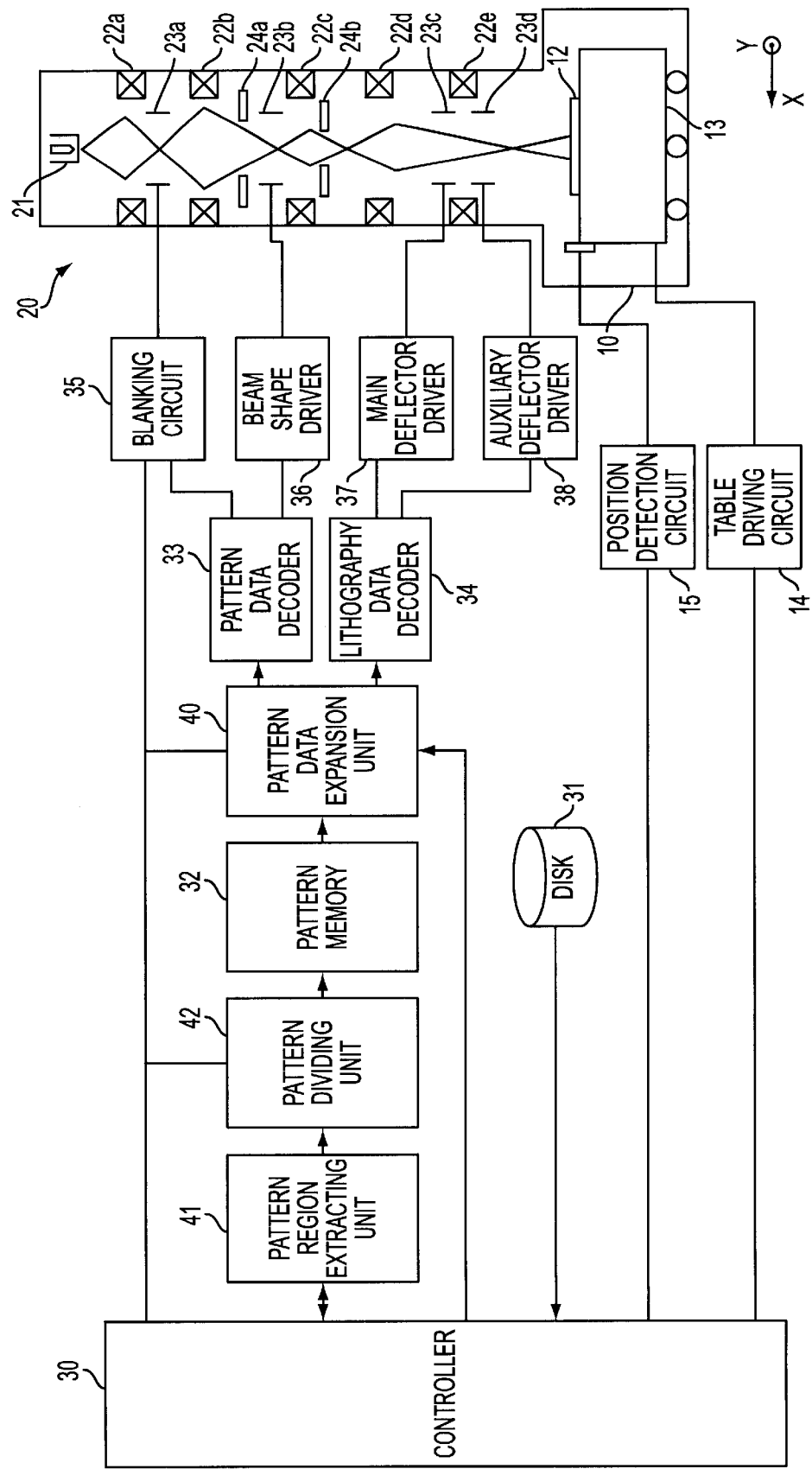
FIG. 1 is a schematic structure diagram showing an electron beam lithography system, which is a kind of a pattern lithography system, according to a first embodiment of the present invention.

FIG. 1 is a schematic configuration diagram showing an electron beam lithography system, which is a type of pattern lithography system, according to a first embodiment of the present invention. Although the lithography system shown in FIG. 1 is a so-called variable shaped beam type electron beam lithography system for lithographing with a desired sectional shaped beam such as a triangle shaped beam, rectangle shaped beam, etc., the present invention can be applied to a lithography system using a Gaussian beam. Further, although the lithography system shown in FIG. 1 utilizes a vector scan method to scan the beam, the present invention can be also applied to a lithography system using a raster scan method. Furthermore, although the lithography system shown in FIG. 1 comprises two deflectors including a main deflector and an auxiliary deflector, the present invention can be also applied to a lithography system having only a main deflector or having three or more deflectors.

Figure 2:
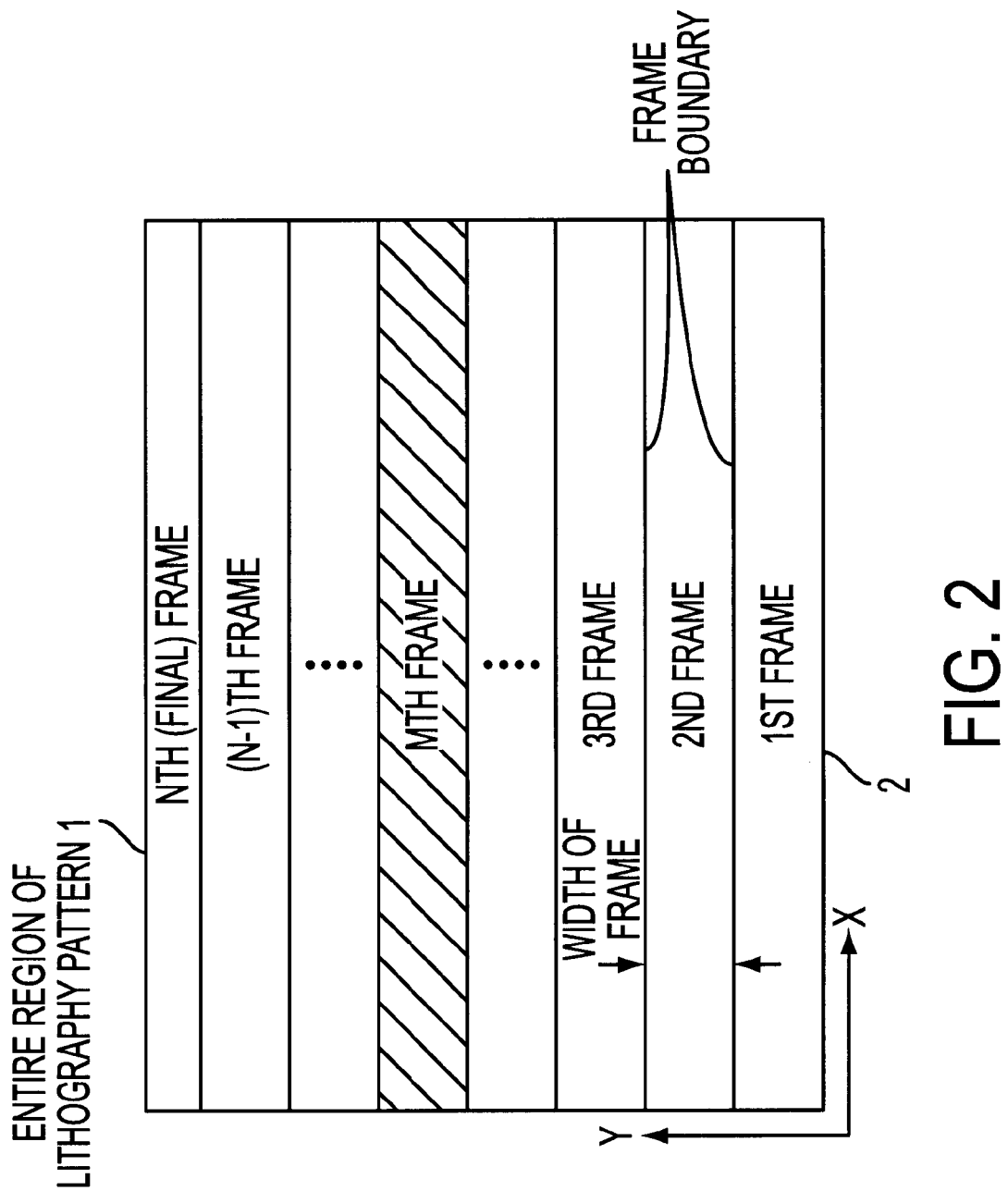
FIG. 2 is a diagram showing a lithography pattern region that is divided into a plurality of frames.
Figure 3:
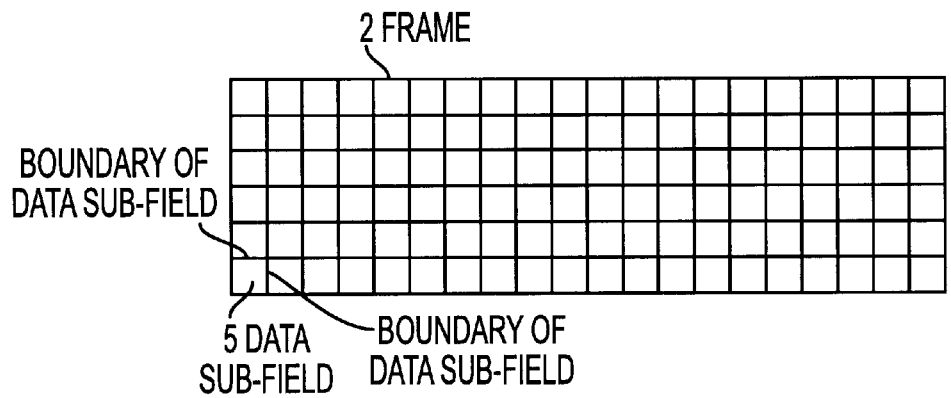
FIG. 3 is a diagram showing a frame of a lithography pattern that is further divided into sub-fields.

First, as an introduction of the present invention, the data structure for data representing a lithographing a pattern to be lithographed by the lithography system shown in FIG. 1 will be introduced with reference to FIGS. 2 and 3.

For purposes of describing the invention, it is assumed, as shown in FIG. 2, that the entire region of a lithography pattern 1 is defined such that it is divided into adjoining regions 2 called 'frames'. With respect to the frame width, it is typically defined to be the same as the maximum deflecting range within which the electron beam can be deflected by the main deflector, however, the width may be set smaller. It is further assumed that a separate data file corresponds to each frame shown in FIG. 2, and so the entire lithography pattern 1 is represented by n files corresponding to first through nth frames. Each frame is further divided into 'data sub-fields' 5 as shown in FIG. 3. Each individual pattern is defined such that it belongs to the data sub-fields 5 containing it.

The unit of FIG. 3 called the 'data sub-field' 5 in this embodiment is not directly related to a 'lithography sub-field' at the time of lithographing, and is given that name here for distinguishing it from the lithography sub-field data frames. The region 2 of FIG. 3 called a 'frame' is a unit in the lithography data. When lithography is performed, data sub-fields 5 may be extracted from one or more frames and combined to produce the data representing a region to be lithographed. Hereinafter, each successively lithographed region of a pattern is called a 'stripe'.

Lithography data having the above described data structure will be assumed for purposes of describing the invention. However, it is noted that it is not necessary for there to be a file that coincides with each frame of the pattern, and a plurality of frames may be represented by a single data file or the entire lithography pattern may be represented by a single data file. Further, the lithography data may be such that the entire lithography pattern is not divided at all. Further, all or a part of lithography pattern data that is shared in common by at least two frames may be represented by another file which is different from the n files corresponding to the frames. The structure of the lithography data representing a given pattern is not material to the present invention.

Next, a basic structure of the pattern lithography system of the invention will be described with reference to FIG. 1. A sample chamber 10 accommodates an X-Y table 13 on which a semiconductor substrate 12 such as a mask or the like is placed. Hereinafter, the mask will be represented in behalf of the semiconductor substrate 12. The X-Y table 13 can be driven to directions along an X-axis (a horizontal axis on FIG. 1) and a Y-axis (an axis perpendicular to FIG. 1) by a table driving circuit 14. A position of the X-Y table 13 is measured by a position detection circuit 15 including a length measuring sensor by using a laser or the like.

An electron beam optical system 20 is installed above the sample chamber 10. The electron beam optical system 20 includes an electron gun 21 for generating an electron beam, various types of lenses 22a, 22b, 22c and 22d for guiding the electron beam, a blanking deflector 23a, a beam dimension variable deflector 23b, a main deflector 23c for scanning the electron beam, an auxiliary deflector 23d for scanning the electron beam, and two apertures 24a and 24b for shaping the electron beam.

The main deflector 23c deflects the electron beam into a predetermined auxiliary deflecting region, which means the lithography sub-field, and the auxiliary deflector 23d deflects the electron beam into a position for lithographing within the lithography sub-field. The sectional shape of the beam is controlled by the beam dimension variable deflector 23b and the apertures 24a and 24b, and the X-Y table 13 is continuously driven into a single direction along the X-axis so as to lithograph in the lithography sub-field. In the case when lithographing of one lithography sub-field is completed in this manner, lithographing of a next lithography sub-field will be started.

When lithographing of all the lithography sub-fields which form the stripe is completed, the X-Y table 13 is then driven by one step in the direction along the Y-axis which is perpendicular to the continuous driving direction and then, the above operation is repeated to successively lithograph in each stripe. Here, the stripe is identical with a striped lithography region determined by a deflecting width of the main deflector 23c, and the lithography sub-field is identical with a unit lithography region determined by the deflecting width of the auxiliary deflector 23d.

According to the first embodiment, the lithographing method is as follows. First, an instruction signal for initiating lithographing is sent to a controller 30 such as a computer. After receiving this instruction signal, the controller 30 makes access to a disk 31 which is a magnetic storage medium connected thereto so as to obtain information concerning the lithography such as the size of the lithography pattern, the number frames and the width of the frames constituting the lithography pattern etc., and also determines the number of steps in the multiple lithography so as to determine a first stripe to be lithographed.

In this embodiment, a magnetic storage tape, an optical storage disk and a magneto-optical storage disk as well as the magnetic storage disk can be used as the disk 31. Further, according to a preferred embodiment, the lithography stripe is preferred to be shifted after each lithographing step so that multiple lithography is performed, however, the stripe is not required to be shifted.

Next, the controller 30 outputs information concerning the stripe and a pattern extraction instruction signal to a pattern region extracting unit 41. After receiving that information, the pattern region extracting unit 41 determines the frame number(s) corresponding to the specified stripe and a region which must be extracted from each frame data, by analyzing lithography pattern data stored in the disk 31. The region to be extracted is assumed to be represented in the lithography frame data files by data $\{f^s_1, f^s_2, \ldots, f^s_k\}$. The superscript S of $f^s_k$ indicates a number of a stripe in which it is currently paid attention. Generally, the region that must be extracted is different for each stripe.

In a first embodiment of the invention, the pattern region extracting unit 41 carries out the following process for each stripe. First, the pattern region extracting unit 41 accesses the disk 31 so as to receive a lithography pattern data for the region $f^s_1$ for the stripe and the received lithography pattern data is transmitted to a pattern dividing unit 42. The pattern region extracting unit 41 is also instructed to carry out a cluster dividing process. The pattern dividing unit 42 receives lithography pattern data to be divided into clusters from the pattern region extracting unit 41, and also receives a cluster size from the controller and then divides the lithography data into clusters according to the cluster size. The divided lithography pattern data is stored into a pattern memory 32.

Such processes are also carried out for the regions $f^s_2, \ldots, f^s_k$ in a same way. In the case when the cluster dividing process of the region $f^s_k$ is completed, the signal that indicates the completion of the cluster dividing process is transmitted to the controller 30. When receiving this signal, then the controller 30 transmits an instruction signal for expanding the divide lithography pattern data that is stored in the pattern memory 32 to a pattern data expansion unit 40.

Note that the pattern memory 32 is not required to be a single memory device. It is possible to combine a plurality of memory devices so that the regions $f^s_1, f^s_2, \ldots, f^s_k$ that are divided into clusters can be stored in independent memory devices, or each lithography pattern data divided into the clusters which belongs to a different stripe can be stored separately in a corresponding memory device. Further, it is also possible to provide the pattern memory 32 using reserved memory devices, one of which holds first divided lithography pattern data produced by the cluster division of a part of the lithography pattern data which constitutes the lithography pattern and is referred to in common by a plurality of frames, and one of which holds second divided lithography pattern data produced by cluster division of the frame that constitutes the lithography pattern.

In this embodiment, the explanation concerning the processes carried out by the pattern data expansion unit 40 and the following lithographing steps will be made based on the description in the Japanese Patent Disclosure No. 10-032188. However, the details of these features are not material to the present invention, and it is possible to practice the invention with various modifications of these features.

First, the lithography pattern data obtained by the pattern data expansion unit 40 is analyzed by a pattern data decoder 33 and a lithography data decoder 34, which are data analyzing portions, and are transmitted to a blanking circuit 35, a beam shaper driver 36, a main deflector driver 37 and an auxiliary deflector driver 38 as shown in FIG. 1.

The pattern data expansion unit 40 of the first embodiment may have a function of selecting and extracting data which is stored in the pattern memory 32 and which represents the stripe preset by the controller 30. In the case when the pattern data expansion unit 40 has such a function, the data extracted by the pattern region extracting unit 41 must contain at least enough data to constitute the stripe, but may contain additional data. The pattern data expansion unit 40 distributes the cluster to the data sub-field according to a preset method including the shift of the data sub-field, instructed by the controller 30. The size of the data sub-field to be preset at this time may be varied depending on each lithography step of the multiple lithography.

Blanking data is produced by the pattern data decoder 33 based on the above described data, and the data is transmitted to the blanking circuit 35. Further, desired beam dimension data is produced and sent to the beam shaper driver 36. A predetermined deflection signal is then applied from the beam shaper driver 36 to the beam dimension variable deflector 23b of the electron beam optical system 20, and as a result, the dimension of the electron beam is controlled.

Positioning data for the data sub-field is produced by the lithography data decoder 34 and sent to the main deflector driver 37. A predetermined deflection signal is then applied from the main deflector driver 37 to the main deflector 23c of the electron beam optical system 20, and as a result, the predetermined data sub-field is scanned with the electron beam. Further, a control signal for scanning of the auxiliary deflector is produced and sent to the auxiliary deflector driver 38. A predetermined auxiliary deflection signal is applied from the auxiliary deflection driver 38 to the auxiliary deflector 23d so as to lithograph within the lithography sub-field.

Figure 4:
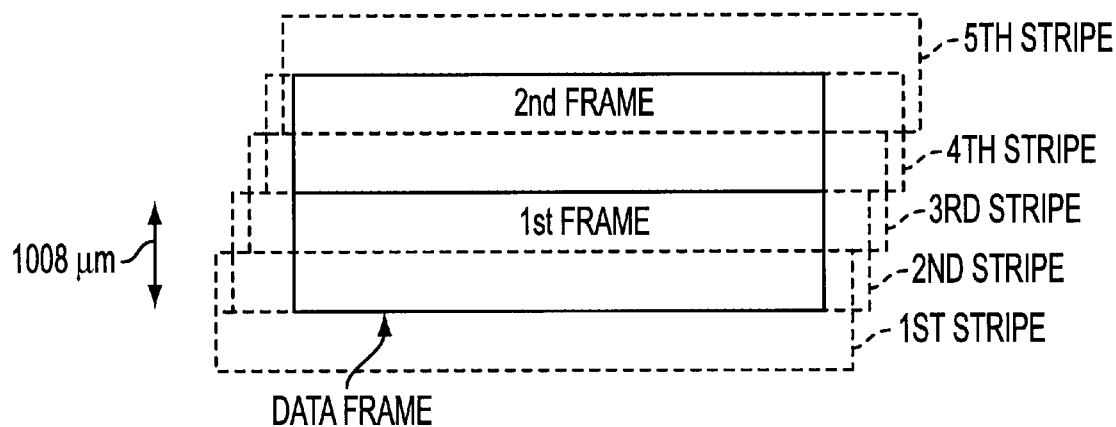
FIG. 4 is a diagram showing a lithography pattern comprised of stripes representing regions having shifted deflection boundaries.

Next, a processing method of the pattern region extracting unit 41 and the pattern dividing unit 42 according to the first embodiment of the invention will be described in detail. FIG. 4 shows an example of a lithography pattern that will be referred to in the following explanation. In this example, the entire lithography pattern data is composed of two data frames, and the frame width is 1008 $\mu$m. Multiple (overlap) lithographing of this pattern according to this embodiment will be described as an example.

First, the controller 30 receives an instruction signal to perform multiple lithographing, and the lithography process is started. The controller 30 accesses the lithography pattern data stored in the disk 31, analyzes the size and number of frames of the lithography pattern, and determines the five stripes as illustrated in FIG. 4 that will be used to perform the multiple lithography. In this embodiment, as shown in FIG. 4, five stripe regions having a width of 1008 $\mu$m are shifted by 504 m respectively so as to form a stripe region. Then, lithographing is executed in the order of a first stripe, a second stripe, a third stripe, a fourth stripe and a fifth stripe. Although each stripe boundary in FIG. 4 is progressively shifted along the X-axis to express this example more clearly, in practice the stripe boundaries in the X-axis do not need to be shifted.

Next, lithographing of the first stripe will be described. The controller 30 transmits an instruction signal for extracting lithographing data representing the first stripe to the pattern region extracting unit 41. The pattern region extracting unit 41 receives this instruction signal and accesses a lithographing data stored in the disk 31. Further, the pattern region extracting unit 41 analyzes the lithographing data in the first stripe and determines that the lithographing data for the first stripe is identical to a lower half '$f^1_1$' of the first frame in FIG. 5A. Accordingly, the data shown in FIG. 5B, which represents the pattern of the first stripe, is extracted from the first frame of the lithographing data and is transmitted to the pattern dividing unit 42.

Figure 6:
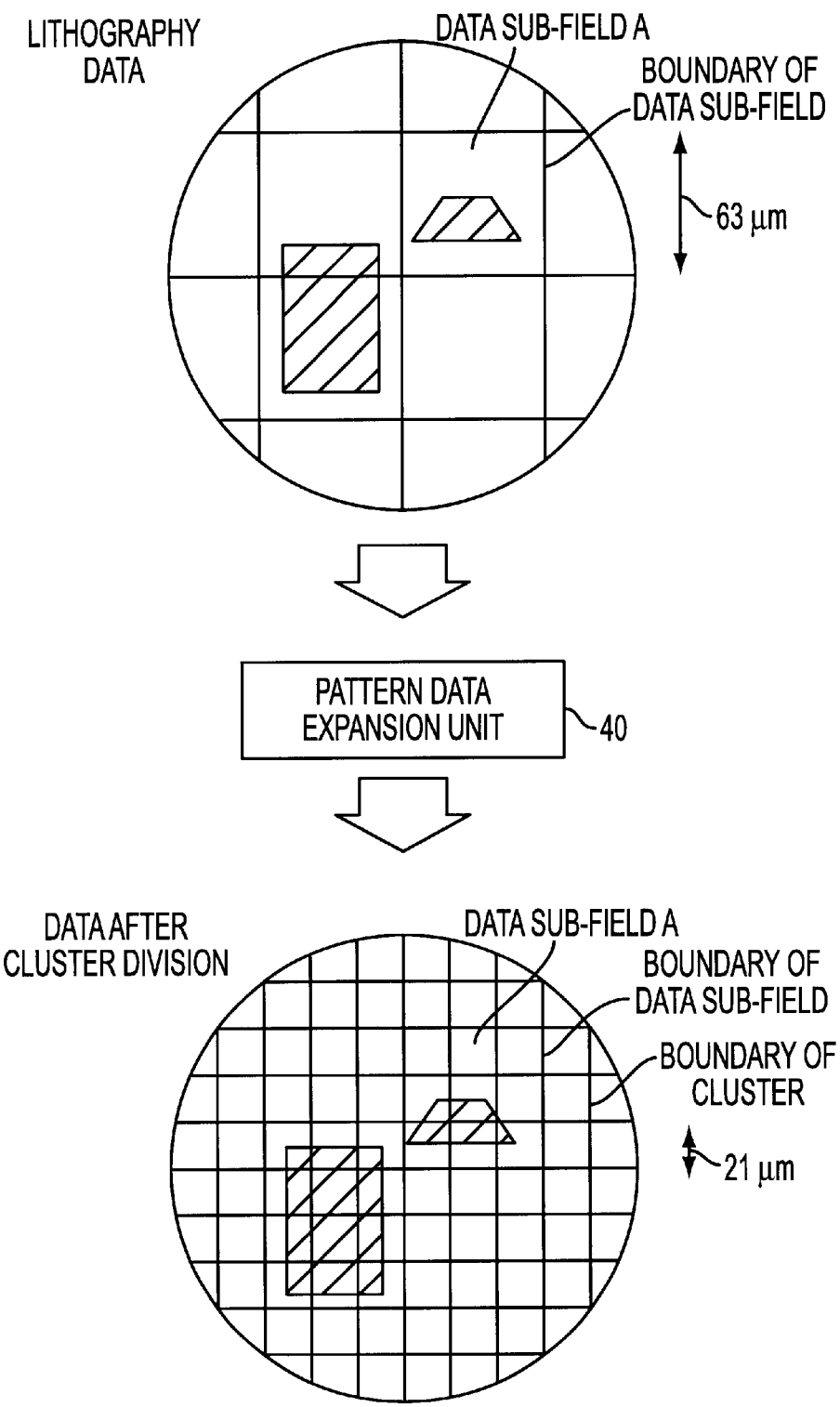
FIG. 6 is a diagram showing an enlargement of an area A of the lithography data.

Next, the pattern dividing unit 42 carries out the cluster dividing process. The cluster dividing process will be explained using area A of FIG. 5B as an example. An upper diagram of FIG. 6 is an enlargement of the lithographing data, which is identical to area A in FIG. 5B, which has been extracted by the pattern region extracting unit 41. In this example, it is assumed that the lithographing data is divided into data sub-fields having equal widths of 63 $\mu$m. The pattern dividing unit 42 divides each data sub-field into clusters. In this example, it is assumed that each cluster has an edge length of 21 $\mu$m, and a lower diagram of FIG. 6 shows the data after the cluster dividing process. The pattern dividing unit 42 stores this data after the cluster dividing process in the pattern memory 32.

In the case of processing the first stripe, the region to be extracted is only the lower half ($f^1_1$) of the first frame and therefore, when the signal which notifies that the cluster dividing process has been terminated is output to the controller 30, the processes of extraction and division are terminated. The controller 30 receives the signal and then initiates operation of the pattern data expansion unit 40. The pattern data expansion unit 40 provides data for driving the pattern data decoder 33 and the lithography data decoder 34 in the above described process to lithograph the first stripe.

Figure 7A:
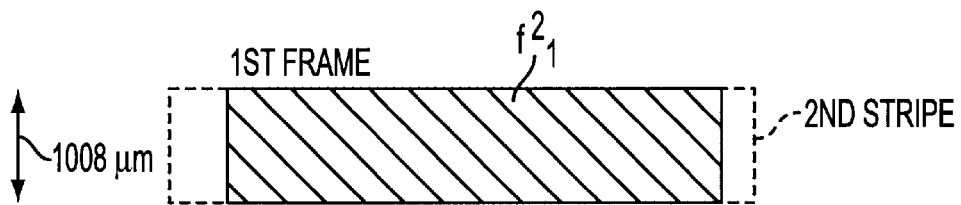
FIG. 7 is a diagram showing the relationship between first and second frames and second-fifth stripes.

After completing the lithography of the first stripe, the process proceeds to lithograph the second stripe. The controller transmits an instruction signal for extracting the region of the second stripe to the pattern region extracting unit 41. A region necessary for lithographing the second stripe is the entire first frame ($f^2_1$) as shown in FIG. 7A. The pattern region extracting unit 41 extracts the entire first frame and transmits it to the pattern dividing unit 42, and outputs an instruction signal for the cluster dividing process thereto. After receiving this instruction signal, the pattern dividing unit 42 executes the cluster dividing process upon the data shown in FIG. 7A, stores the divided data in the pattern memory 32 and notifies the controller 30 that the cluster dividing process has completed. The controller 30 transmits an instruction signal to the pattern data expansion unit 40 to initiate lithographing of the second stripe.

Figure 7B:
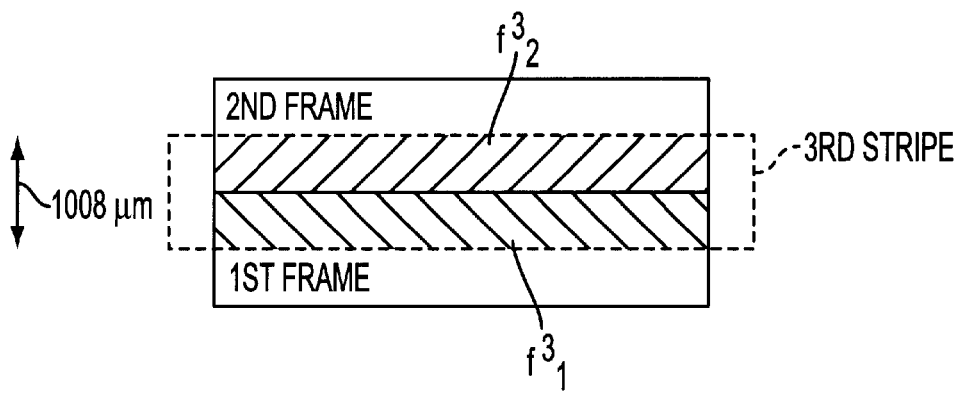

After completing the lithography of the second stripe, the process proceeds to lithograph a third stripe. First, the controller 30 defines the region of the third stripe and transmits an instruction signal for extraction of the corresponding lithography data to the pattern region extracting unit 41. The pattern region extracting unit 41 analyzes the lithography data stored in the disk 31 and determines that data of both the first frame and the second frame are required for lithographing the third stripe. A region, which is indicated in FIG. 7B by right down-hatching, corresponding to the portion of the third stripe represented in the first lithography data frame, is extracted. The data is transmitted to the pattern dividing unit 42 and the pattern dividing unit 42 is instructed to execute the cluster dividing process. The pattern dividing unit 42 executes the cluster dividing process for this region and stores the data divided into the clusters in the pattern memory 32.

After completing this process, the pattern dividing unit 42 receives data of the lower half of the second lithography data frame, which is shown in FIG. 7B as left down hatching, from the pattern region extracting unit 41, and divides that data into clusters and adds it to the pattern memory 32. At this stage, the upper half of the first frame and lower half of the second frame are both divided into the clusters and stored in the pattern memory 32. It is possible to rearrange the cluster-divided data stored in the pattern memory 32 so as to be consistent with the lithographing order, if that is desirable for the system.

Because all the steps for the cluster dividing process necessary for the lithography of the third stripe are terminated, the pattern dividing unit 42 notifies the controller 30 that the cluster dividing process is completed. The controller 30 instructs the pattern data expansion unit 40 to lithograph the third stripe, and then the lithographing of the third stripe is executed.

Figure 7C:
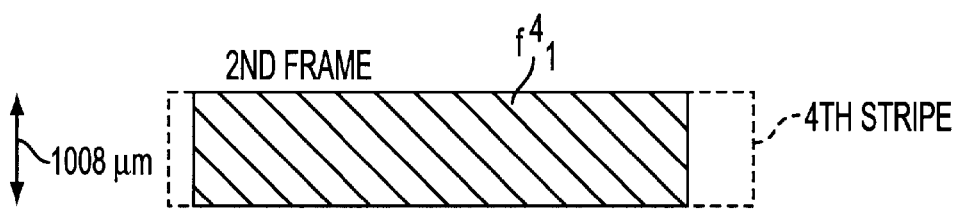
Figure 7D:
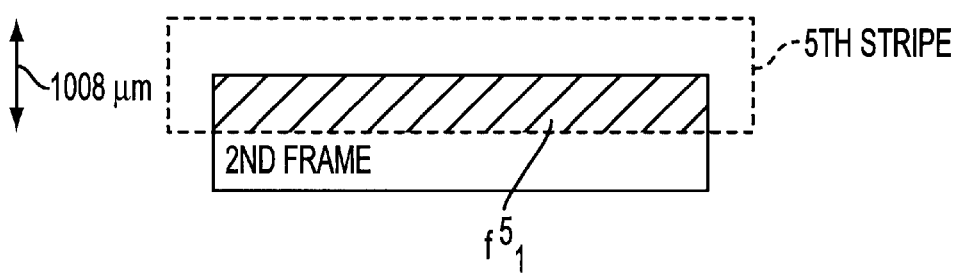

After completing the lithography of the third stripe, the process proceeds to lithograph a fourth stripe. Here, the data required for lithographing the fourth stripe is the entire second frame. The pattern region extracting unit 41 extracts data $f^4_1$ hatched in FIG. 7C. The same process as described for the second stripe is carried out so as to execute the lithography of the fourth stripe. When the lithography of the fourth stripe is completed, lithographing of a fifth stripe shown in FIG. 7D is similarly executed, and then the multiple lithographing of the entire lithographing pattern data is completed.

Figure 13:
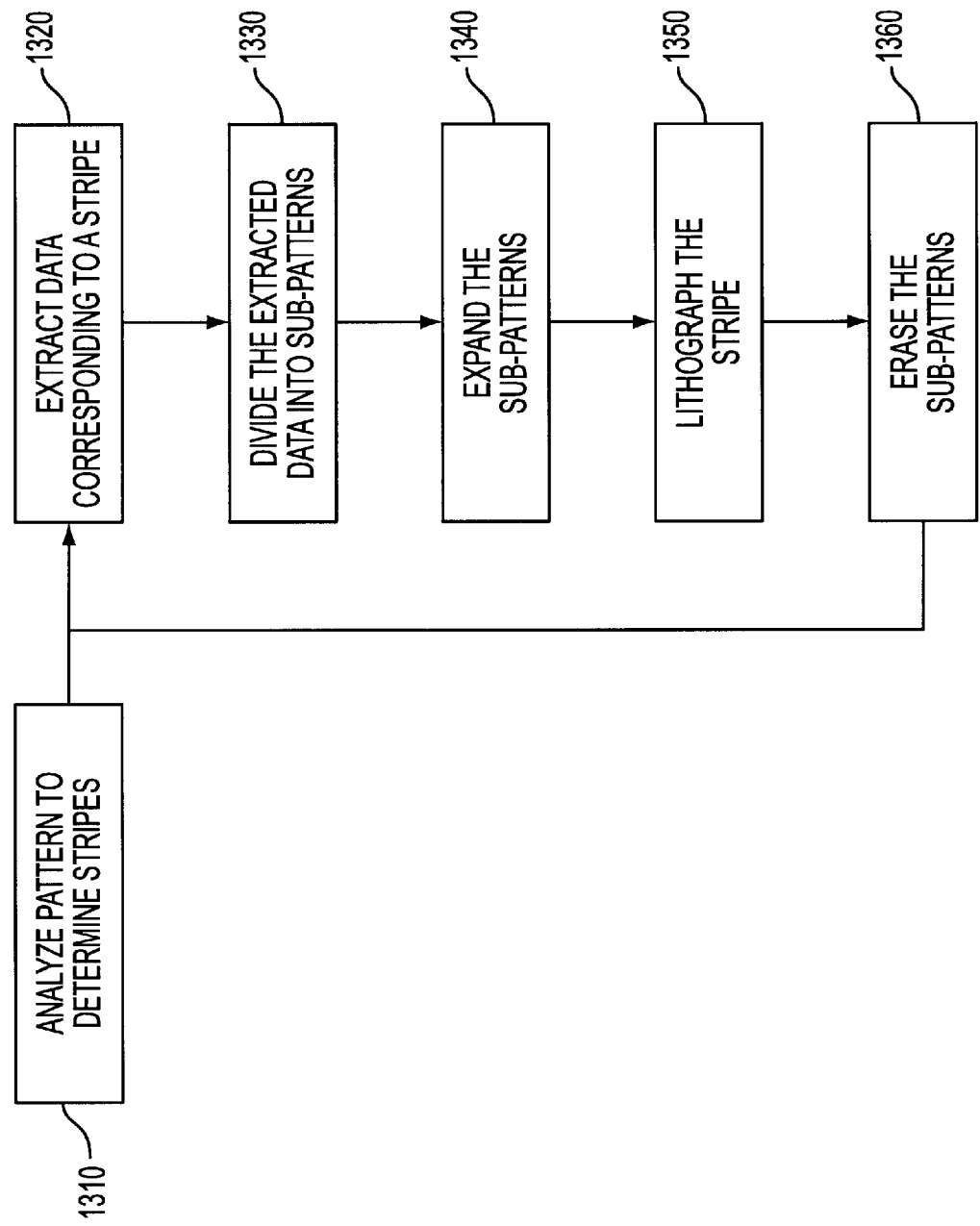
FIG. 13 is a process diagram for the first embodiment of the invention.

The process of the first embodiment is summarized in the diagram of FIG. 13. As shown in FIG. 13, the system analyzes 1310 pattern data to determine n stripes of the pattern that are to be successively lithographed. Then, for each nth stripe, the system successively extracts 1320 a part of the pattern data corresponding to the stripe, and divides 1330 the extracted part of the pattern data into sub-patterns whose size is smaller than a minimum deflection range of the beam. The system then expands 1340 sub-patterns of the extracted part to produce lithography data for driving a lithographing unit to lithograph the stripe, and initiates 1350 lithography of the stripe using the expanded data. The system may then erase 1360 the sub-pattern data from memory (this may occur any time after the sub-pattern data has been expanded). After lithography of the stripe is initiated, the same sub-process of comprising 1320–1360 may be performed for the next successive stripe.

The pattern data expanding unit 40, pattern region extracting unit 41 and pattern dividing unit 42 may be provided with independent hardware, or a general purpose computer in which a program for executing processes including the lithography process as explained above is installed. Further, they may be a processor such as a DSP (Digital Signal Processor) in which the program for executing processes including the lithography process as explained above as explained above is stored. Further, it is possible that such a program can be installed in a single recording medium device such as a magnetic disk drive and communicatively connected to at least one controller and computer.

In the pattern lithography system of this embodiment, for example, in the case of overlap lithographing, it is necessary to divide into the clusters twice for each frame. Such a process is used in this embodiment because it is assumed for this embodiment that the pattern memory 32 has a small capacity that is only sufficient to hold the data for a single stripe. In a system having a pattern memory with a large capacity, the controller 30 may control the lithography process according to the following procedure of the second embodiment of the invention, so that the cluster dividing process for data of a given region of the pattern is performed only once. The process will be described below with reference to FIG. 4.

First, after receiving an instruction for start of the lithographing process, the controller 30 transmits an instruction signal for extracting the data representing the first frame to the pattern region extracting unit 41. The pattern region extracting unit 41 then accesses the lithography data stored in the disk 31 and transmits the data concerning the first frame to the pattern dividing unit 42.

The pattern dividing unit 42 receives the data representing the first frame, divides the data into clusters and stores the cluster-divided data in the pattern memory 32. Because the cluster dividing process for the first frame is terminated, the pattern dividing unit 42 transmits an end signal to the controller 30 so as to indicate termination of the process. The controller 30 receives the end signal and initiates operation of the pattern data expansion unit 40 and transmits an instruction signal for lithographing the first stripe. The pattern data expansion unit 40 drives the pattern data decoder 33 and lithography data decoder 34 in the above described steps so as to lithograph the first stripe.

Figure 8:
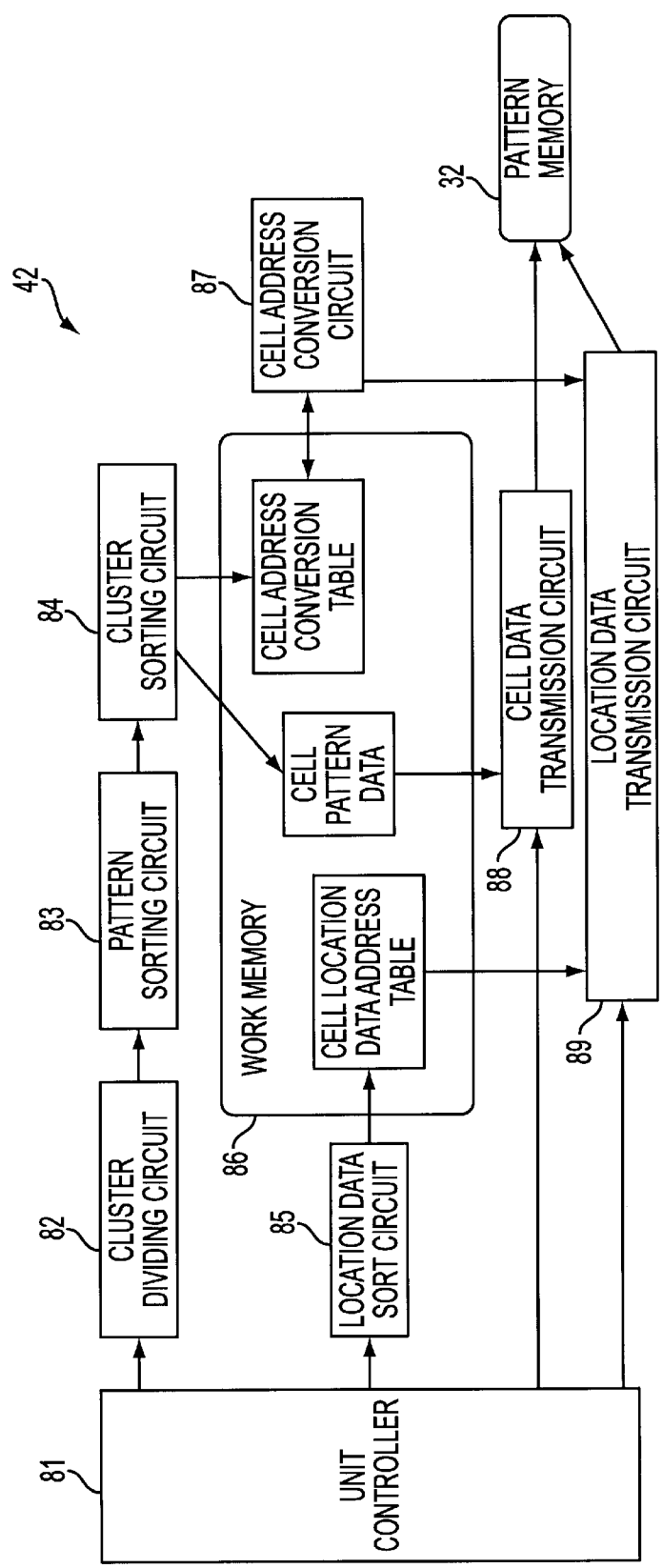
FIG. 8 is a block diagram showing details of a pattern data dividing unit.

Here, the process of the pattern dividing unit 42 will be described. FIG. 8 is a detailed block diagram showing the pattern dividing unit 42. The pattern dividing unit 42 includes a unit controller 81, a cluster dividing circuit 82, a pattern sorting circuit 83, a cluster sorting circuit 84, a location data sorting circuit 85, a work memory 86, a cell address conversion circuit 87, a cell data transmission circuit 88, a location data transmission circuit 89 and the like. The process of each circuit will be described with reference to FIG. 9, which is an enlargement of the data sub-field shown in FIG. 6.

Within the lithography data stored in the disk 31, the pattern data is defined in units called a 'cell'. Because a type in which the cell is referred while processing the frame has recently become conventional, in a preferred embodiment, it is assumed that lithography data having a cell structure is stored in the disk 31.

Figure 9:
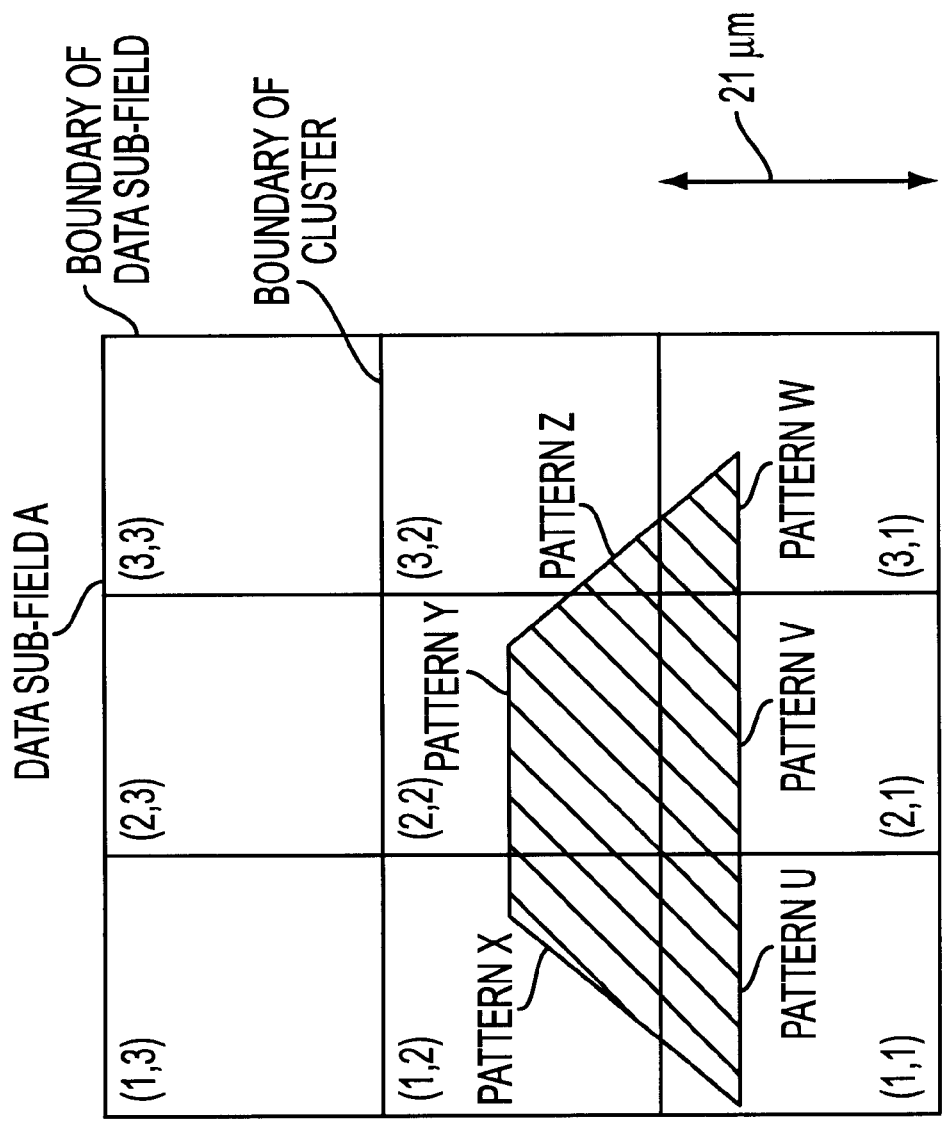
FIG. 9 is a diagram showing an enlargement of a data sub-field A of FIG. 6.

The unit controller 81 extracts the cells from among the lithography data which is received from the pattern extracting unit 41, and outputs the cells one by one to the cluster dividing circuit 82. The cluster dividing circuit 82 divides each data sub-field in the cell into clusters. Referring to FIGS. 6 and 9, the cluster dividing circuit 82 sets cluster boundaries in the data sub-field A of an upper diagram of FIG. 6 at each specified cluster dividing width. In this example, the cluster dividing width is set at 21 $\mu$m and the data sub-field is divided into nine clusters as shown in FIG. 9.

In this embodiment, two indexes X, Y are applied and each cluster is represented by (X, Y). The cluster dividing circuit 82 divides the pattern on the boundary and determines to which cluster the divided pattern belongs. In the case of the data sub-field A, a single isosceles trapezoid is divided into six patterns U to Z as shown in FIG. 9, and the divided patterns are allocated to each cluster and stored in the work memory 86. For example, the divided pattern U is determined to belong to cluster (1, 1) so as to register in cluster (1, 1) and be stored in the work memory 86. When the cluster dividing process of all the data sub-fields existing in a single cell is completed, then the pattern sorting circuit 83 is operated.

The pattern sorting circuit 83 sorts the cell data, which is divided into the clusters, to be stored in the work memory 86 so that the pattern of respective clusters are arranged in an order suitable for the pattern lithography system. When the pattern sorting process is completed, then the cluster sorting circuit 84 is operated. The cluster sorting circuit 84 sorts each data sub-field of the cell so that the clusters are arranged in an order suitable for the pattern lithography system.

According to this embodiment, each data sub-field is sorted so that an address of a lower left point of each cluster is assumed to be the minimum address (1,1). That is, the clusters shown in FIG. 9 are sorted in the order of (1, 1), (1, 2), (1, 3), (2, 1), (2, 2), (2, 3), (3, 1), (3, 2), (3, 3). Although each address of the cell in the lithography data can be referred to by using a pointing arrow and indicating on the frame, the cluster dividing process generally increases the number of the divided pattern and the amount of the pattern data, so that there may occur a problem in which the address becomes changed. For this reason, the cluster sorting circuit 84 counts the amount of the cell in the pattern data divided into the clusters, and produces an address table for converting the cell address before the cluster dividing process and after the cluster dividing process.

In the case when the entire cluster dividing process of the cell defined in the first stripe is completed, the cell data transmission circuit 88 is operated, and the cell data stored in the work memory 86 is transmitted to the pattern memory 32. After completing this transmission on all the cells stored in the work memory 86, the unit controller 81 outputs a signal which indicates that the cluster dividing process of all the cells is completed to the controller 30.

On the other hand, the location data of the cells of one or two frames being input is sorted by the location data sorting circuit 85 so that they are arranged in an order of the stripe that is suitable for the pattern lithography system, and the address table for the location data of the cells is produced according to that order. The location data transmission circuit 89 is then operated and the address table is transmitted to the pattern memory 32 according to the address table. At this time, the value of an address of the pointing arrow is converted to a cell address after the cluster division process by the cell address conversion circuit 87. In the case when the transmission of all the cell location data of the first stripe is completed, the unit controller 81 outputs a signal which includes that the cell location data has transmitted to the controller 30, and the control computer 30 executes lithographing of the first stripe.

When completing the lithography of the first stripe, the controller 30 then starts to control the lithography for the second stripe. The pattern memory 32 contains pattern data, provided by dividing the first frame into the clusters, that has not yetbeen erased. For the lithography of the second stripe, there is no frame required to be newly divided into the clusters. Therefore, the controller 30 starts to operate the pattern data expansion unit 40 directly without operating the pattern region extracting unit 41 and pattern dividing unit 42, so as to transmit an instruction signal for executing the lithography of the second stripe. The pattern data expansion unit 40 drives the pattern data decoder 33 and lithography data decoder 34 in the above described manner so as to lithograph the second stripe.

When the lithography of the second stripe is completed, the lithography of the third stripe is carried out. In this case, the controller 30 determines through analysis of the pattern data that pattern data of the second frame is necessary for lithographing the third lithography stripe. The controller 30 then instructs the pattern region extracting unit 41 to extract the lithography data for the second frame of the pattern and to transmit it to the pattern dividing unit 42.

The pattern dividing unit 42 receives the data concerning the second frame, divides it into the clusters, and stores the cluster-divided data in the pattern memory 32. When the cluster dividing process of the second frame is completed, the pattern dividing unit 42 transmits an end signal to the controller 30 to indicate termination of the process. At this stage, the pattern memory 32 stores the pattern data provided by dividing the first frame into the clusters and the pattern data provided by dividing the second frame into the clusters.

Next, the controller 30 receives the signal that indicates that the cluster dividing of the second frame is completed, and initiates operation of the pattern data expansion unit 40 by transmitting an instruction signal for the lithography of the third stripe. The pattern data expansion unit 40 extracts the portion of the data required for lithographing the third stripe from the cluster-divided data of the first and second frames, and operates the pattern data decoder 33, lithography data decoder 34 in the above described manner so as to lithograph the third stripe.

When completing the lithography of the third stripe, the controller 30 then starts to control the lithography of the fourth stripe. First, the controller 30 determines through analysis that the pattern data of the first frame is not necessary for lithographing the fourth stripe or any further stripes. The controller 30 therefore erases the pattern data of the first frame from the pattern memory 32. At this stage, the pattern memory 32 contains only the pattern data provided by dividing the second frame into the clusters.

There are no additional frames that are required for the lithography of the fourth stripe. Therefore, the controller 30 does not need to operate the pattern region extracting unit 41 and pattern dividing unit 42 but instead operates the pattern data expansion unit 40 directly, and so the controller 30 transmits an instruction signal for the lithography of the fourth stripe. Then, the lithography of the fourth stripe is completed according to the process steps described above. When the lithography of the fourth stripe is completed, the lithography of the fifth stripe is carried out likewise, so that lithography of the entire lithography pattern data is completed.

Figure 14:
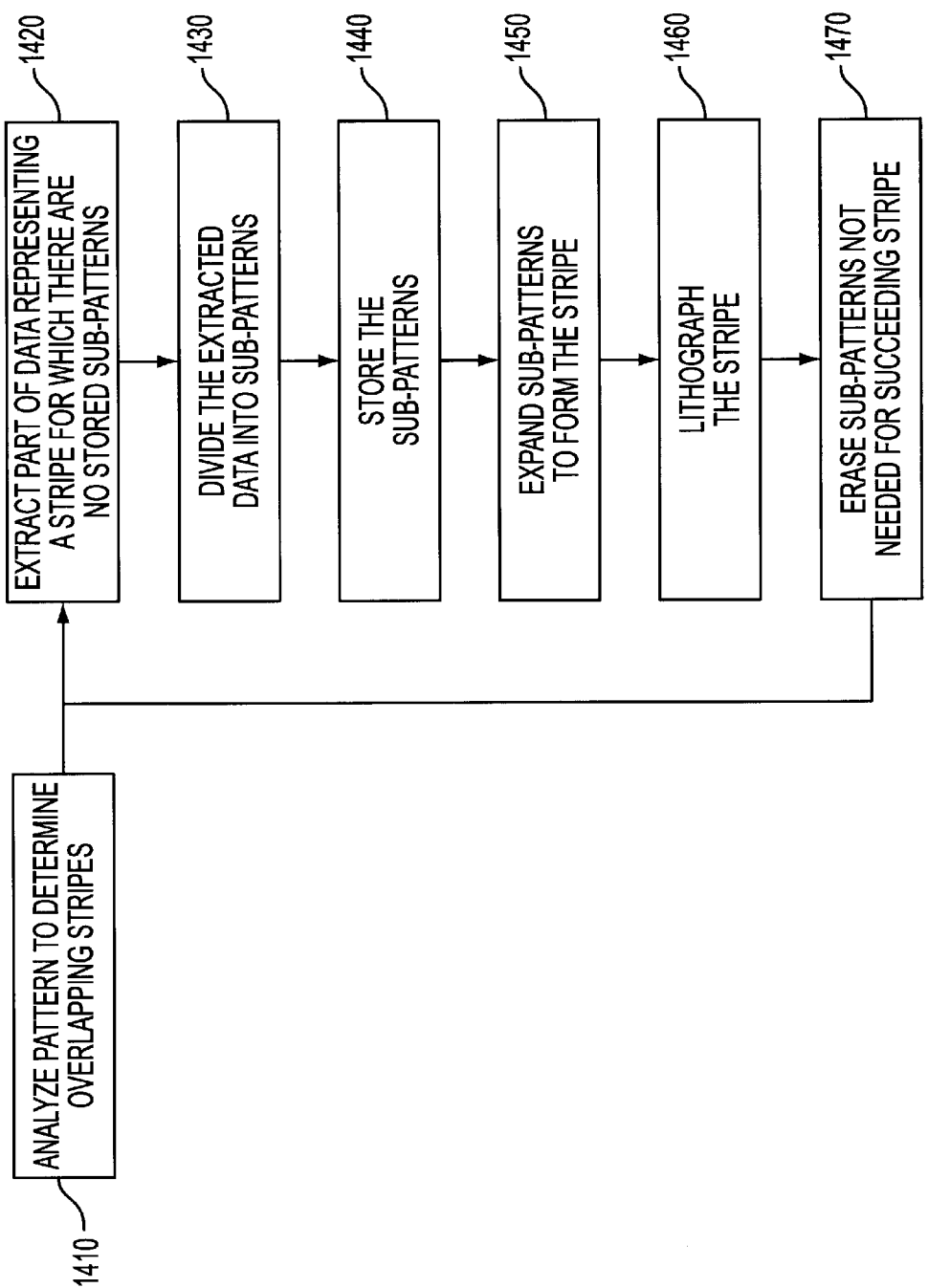
FIG. 14 is a process diagram for the second embodiment of the invention.

The process of the second embodiment is summarized in the diagram of FIG. 14. As shown in FIG. 14, the system analyzes 1410 the pattern data to determine overlapping stripes of the pattern to be successively lithographed. Then, for each nth stripe, the system extracts 1420 a part of the pattern data representing the stripe for which sub-patterns are not already stored, and divides 1430 the extracted part of the pattern data into a plurality of sub-patterns whose size is smaller than a minimum deflection range of the beam and storing the divided data. The sub-patterns of the extracted part are stored 1440, and the system then expands 1450 stored sub-patterns to produce lithography data for driving a lithographing unit to lithograph the stripe, and initiates 1460 lithography of the stripe using the expanded data. The system may then erase 1470 from memory sub-pattern data that is not needed for lithographing succeeding stripes (this may occur any time after the sub-pattern data has been expanded). After lithography of the stripe is initiated, the same sub-process of comprising 1420–1470 may be performed for the next successive stripe. In the second embodiment as described above, the process which the pattern region extracting unit 41 actually executes is simply transmission of data for each frame to the pattern dividing unit 42. In this case, a dedicated pattern region extracting unit 41 is not especially required, and the pattern region extracting unit may therefore be implemented as part of the controller, such that the process for transmitting the frame data is carried out directly by the controller 30.

While in the above explanation of the second embodiment it was stated that the pattern region extracting unit 41 is not operated by the controller 30 upon lithographing the second and fourth stripes, the pattern region extracting unit 41 can be operated as a matter of course. In this case, the requirement is satisfied by providing the pattern region extracting unit 41 or pattern dividing unit 42 with a branch function for skipping the extraction process and the cluster dividing process when the cluster division of a region instructed to be extracted has been already been completed and the pattern data concerning the region has been already stored in the pattern memory 32.

Further, while in the above explanation of the second embodiment it was stated that the extraction process and the cluster dividing process are carried out for whole frames, these processes may alternatively be carried out for half frames, for example. That is, after the lower half of the first frame is divided into the clusters and those data are stored in the pattern memory 32, the first stripe is lithographed. Then, after the upper half of the first frame is divided into the clusters and those data are additionally stored in the pattern memory 32, and the second stripe is lithographed. Next, the pattern data in which the lower half of the first frame is divided into the clusters is released from the pattern memory 32. Then, the lower half of the second frame is divided into the clusters and those data are additionally stored in the pattern memory 32. Finally, by using the cluster-divided data obtained by dividing the upper half of the first frame and lower half of the second frame, which are stored in the pattern memory 32, the third stripe is lithographed. The fourth stripe and the fifth stripe are lithographed in the same manner.

Figure 10:
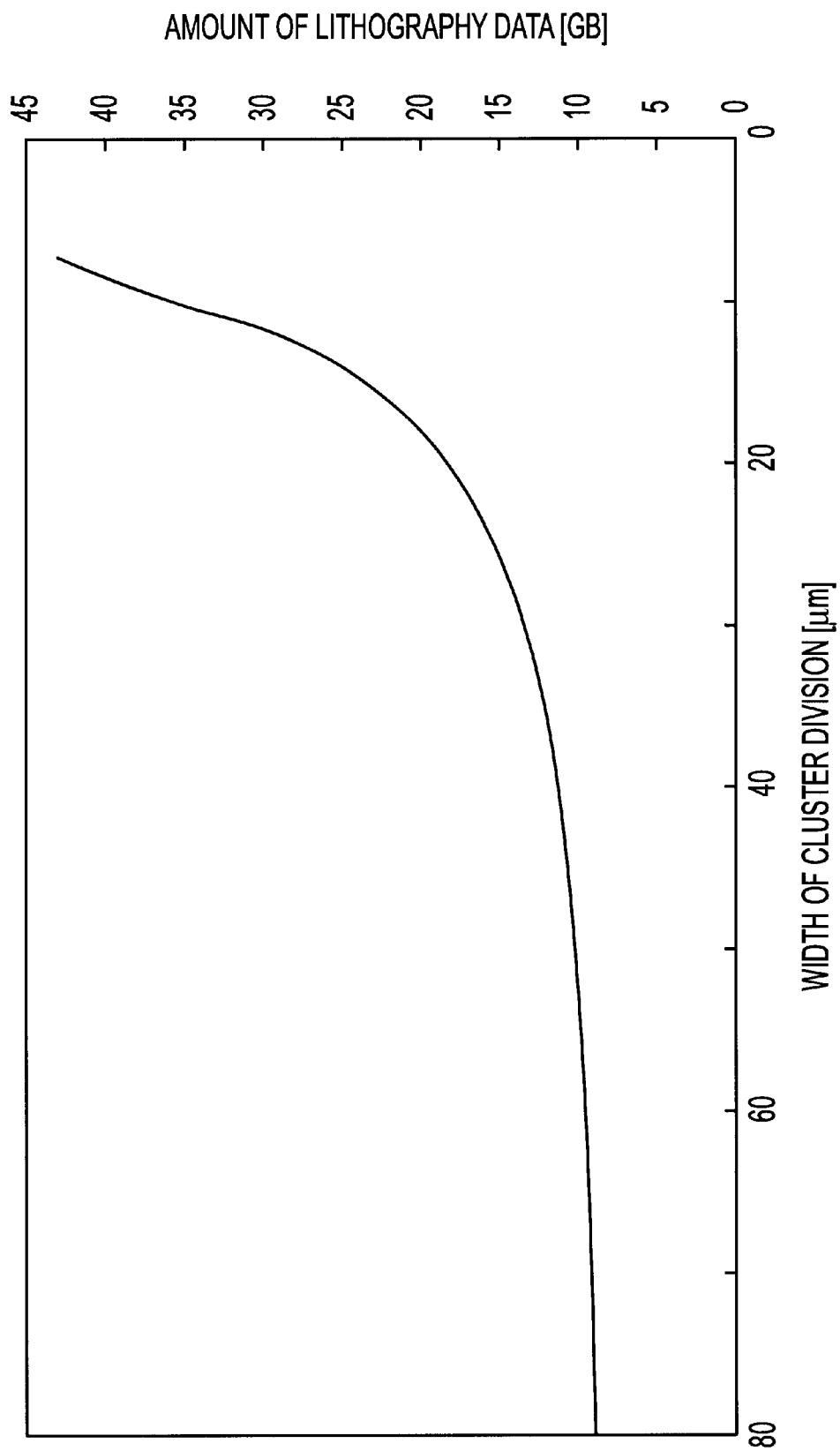
FIG. 10 is a diagram showing a relation between the amount of lithography data and the width of a cluster in a lithography pattern of a typical microprocessor circuit.

Advantages of this embodiment will be described. FIG. 10 is a diagram showing a relation between an amount of data when lithographing the entire chip of a typical microprocessor having a minimum line width of 0.18 μm and a divided width of the cluster. As obvious from this diagram, the smaller the divided width of the cluster becomes, the larger the amount of data becomes. The reason is that a pattern in the vicinity of a cluster boundary is divided into clusters as described above so that the number of divisions of the pattern increases. Although FIG. 10 is an example of a wiring layer of a microprocessor, the same tendency can be found in other layers. The same tendency also exists in products such as DRAM.

The amount of data for lithography to be input to the pattern lithography system will be compared between a conventional example and the present invention according to FIG. 10. It is assumed that the lithography data is divided with a data sub-field size of 63 μm. First, a case of duplex overlap lithography will be considered. A method of the conventional example is assumed to be required lithography data divided into clusters for duplex overlap lithography. In the case when the divided width of the cluster for the duplex overlap lithography is assumed to be 21 μm, it is obvious from FIG. 10 that the amount of data for the lithography necessary for duplex overlap lithography will be approximately 18 GB (Giga-Byte) in the conventional example. In the case when the divided width of the cluster for quadruplex overlap lithography, sextupulex overlap lithography and octuplex overlap lithography is assumed to be 12.6 μm, 9.0 μm and 7.0 μm, the amount of data for the lithography necessary for each overlap lithography will be approximately 30 GB, 38 GB and 43 GB.

On the other hand, if the lithography data is just to be divided into the data sub-fields of 63 μm, the amount of data for the lithography is always approximately 10 GB regardless of the number of multiple steps in the overlap lithography. The above comparison is summarized in Table 1.

TABLE 1

| | Conventional Example | Present Invention | unit: GB<br>Data compression ratio (Example/Invention) |
|---|---|---|---|
| Duplex overlap lithography | 18 | 10 | 1.8 |
| Quadruplex overlap lithography | 30 | 10 | 3.0 |

TABLE 1-continued

| | Conventional Example | Present Invention | unit: GB<br>Data compression ratio (Example/Invention) |
|---|---|---|---|
| Sextepulex overlap lithography | 38 | 10 | 3.8 |
| Octuplex overlap lithography | 43 | 10 | 4.3 |

As compared to the conventional example, it is obvious that the amount of data for the lithography of the present invention is reduced by about half in the case of duplex overlap lithography and by about a quarter in the case of octuplex overlap lithography. According to the present invention, it is made clear that the amount of data for the lithography to be input to the pattern lithography system can be reduced largely.

Although the case of overlap lithography has been described above with regard to the first and second embodiments, a third embodiment of the invention may be practiced in which the system can vary the size of the data sub-field while lithographing using single lithography. That is, corresponding to a size of a mask to be lithographed, the lithographing process can be done by providing a signal representing a size of the data sub-field to the controller 30. For example, the signal of smaller size is instructed when lithographing a higher precision mask, and the signal of larger size is instructed when lithographing a lower precision mask. With reference to FIG. 10, a comparison of the amount of the lithography data between the present invention and the conventional example (assumed that the size of the data sub-field is constant) is obtained as Table 2.

Table 2 shows a case of dividing the data sub-field by 2, 4, 6 and 8. This table indicates that, according to the present invention, the amount of lithography data can be reduced approximately $\frac{1}{1.4}$ to $\frac{1}{4.2}$ compared to the conventional example.

TABLE 2

| | Conventional Example | Present Invention | unit: GB<br>Data compression ratio (Example/Invention) |
|---|---|---|---|
| Divide by 2 | 14 | 10 | 1.4 |
| Divide by 4 | 23 | 10 | 2.3 |
| Divide by 6 | 35 | 10 | 3.5 |
| Divide by 8 | 42 | 10 | 4.2 |

Figure 11:
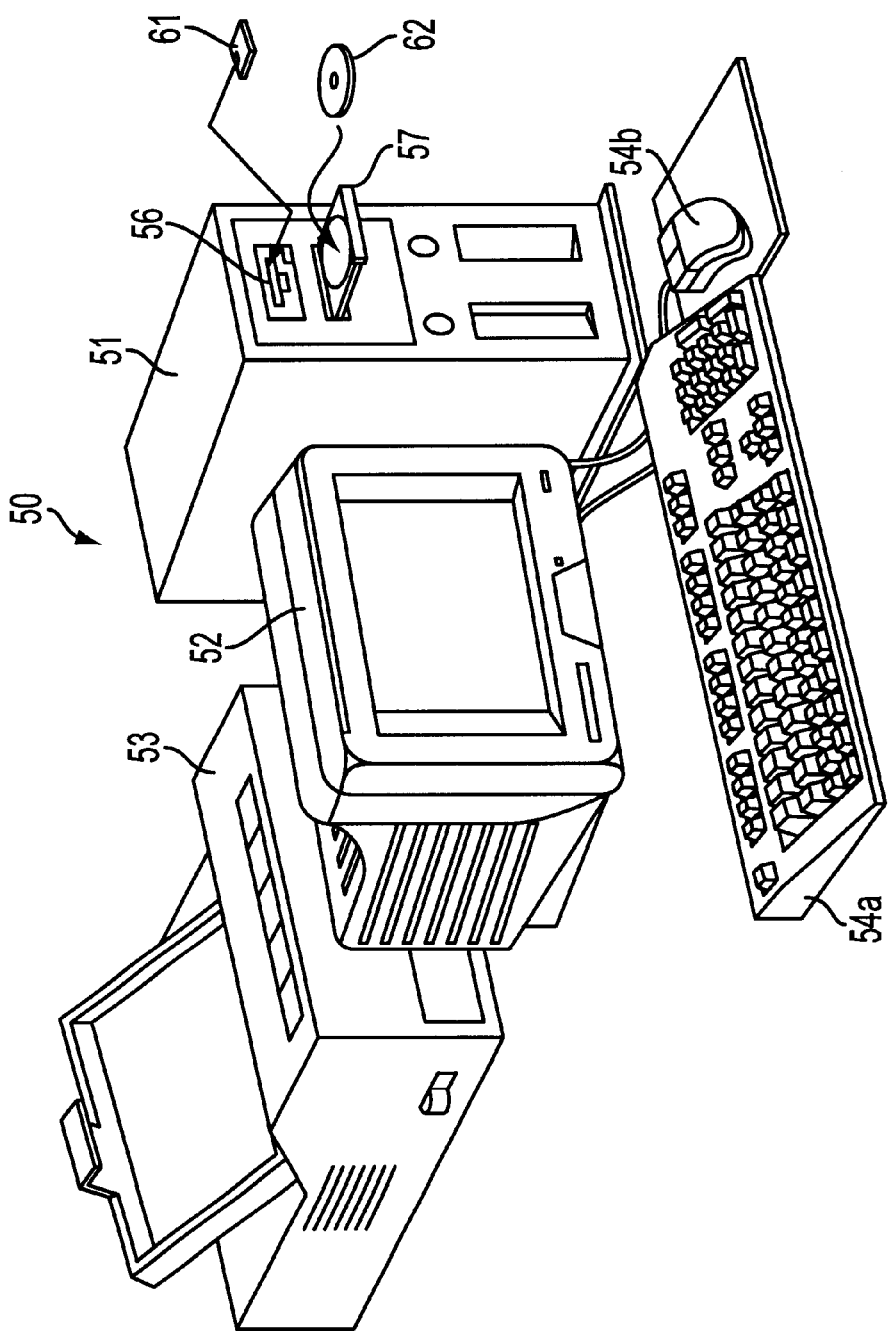
FIG. 11 is a perspective view of a computer system for reading out a pattern lithography processing program from a recording medium according to an embodiment of the present invention.

A recording medium according to the present invention on which a pattern lithography processing program is recorded will be described with reference to FIGS. 11 and 12. A recording medium according to the present invention on which the pattern lithography processing program is recorded is read out by a recording medium driving device that is provided in a computer system as shown in FIG. 11, and used for pattern lithography processing in a pattern lithography system. As shown in FIG. 11, the computer system 50 has a computer main body 51 that is accommodated in a chassis such as a mini-tower, a display device 52 such as a CRT (Cathode-ray Tube), a plasma display, or a LCD (Liquid Crystal Display), a printer 53 as a record output device, a keyboard and a mouse as input devices, a floppy disk drive 56, and an optical disk drive 57.

Figure 12:
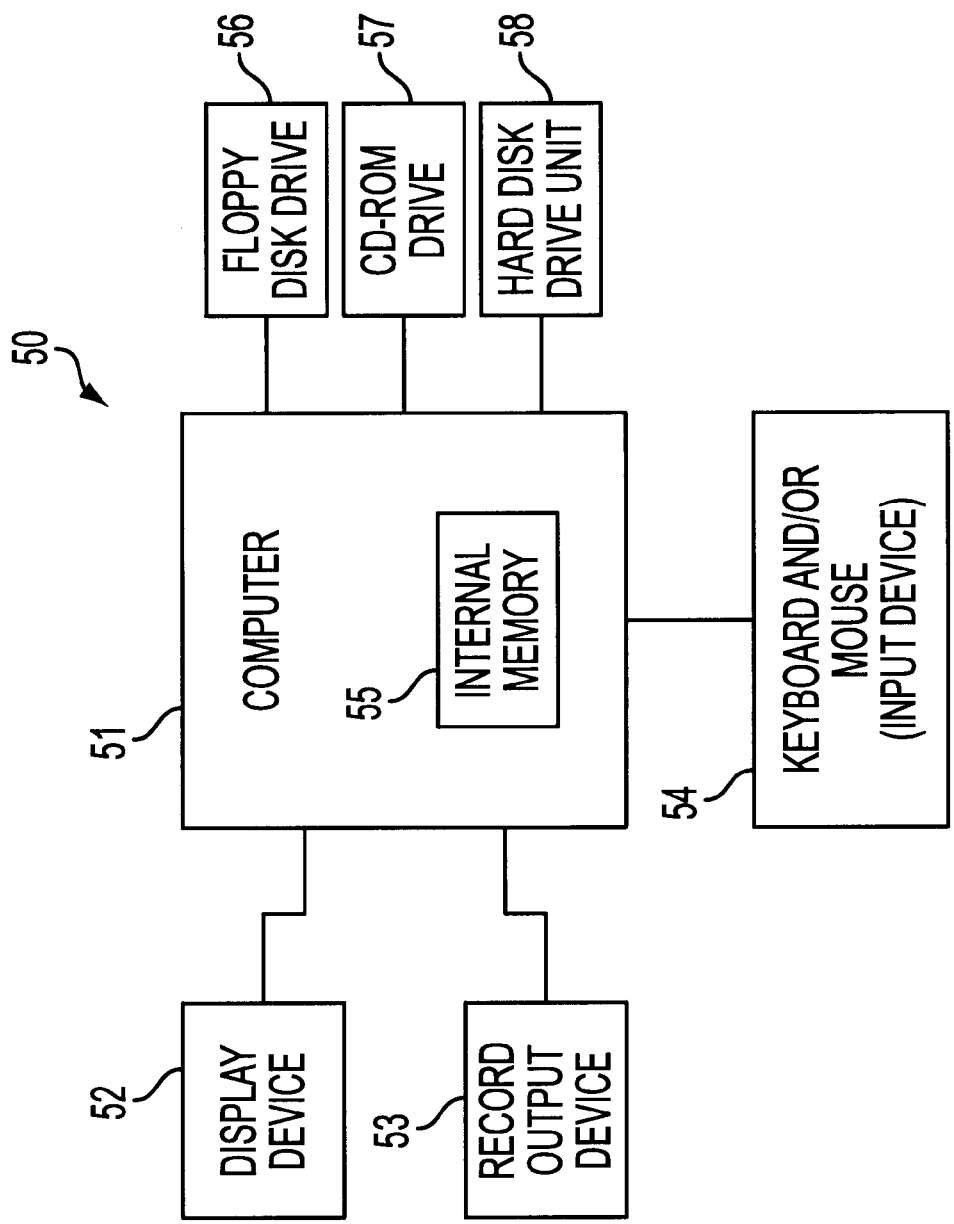
FIG. 12 is a block diagram of the computer system of FIG. 11.

FIG. 12 is a block diagram showing the above configuration. In addition to the computer main body 51, the chassis accommodates an internal memory 55 such as a RAM (Random Access Memory), and an external memory such as a hard disk drive unit 58. As shown in FIG. 11, the pattern lithography processing program that is, for example, recorded on a floppy disk 61 can be read out by using a proper application program when the floppy disk 61 is inserted in a slot. The recording medium on which a program is recorded is not limited to the floppy disk 61, and may be a CD-ROM 62. Other examples of the recording medium are MO (Magneto-Optical disk), an optical disk, a DVD-ROM (Digital Versatile Disk ROM) and a semiconductor memory and the like, which are not shown in FIG. 11.

The pattern lithography processing program that is recorded on the recording medium and can be read out by a computer or the like is one obtained by writing in a computer program format.

The invention is not limited to the configurations of the respective embodiments. Although these embodiments have been explained so that the lithography data is divided into the data sub-fields and further divided into the clusters, the lithography data may alternatively be divided not into data sub-fields but rather into clusters. For example, it is possible that the frame itself is divided into the clusters directly. Further, it is also possible that design data is directly divided into clusters.

Although according to these embodiments, a pattern lithography system using an electron beam is discussed, the present invention is not restricted to this example but also applicable to systems using an ion beam. Further, the present invention can be applied to systems using a laser beam that lithograph by shifting the deflection boundary or varying the field size.

As described above, according to the present invention, the lithography pattern data is successively divided into some regions at the time of lithographing, so that either overlap lithography using shifted deflection boundaries, or single lithography using variable deflecting field size can be carried out. Therefore, it is not necessary to prepare lithography pattern data which is divided so as to have a smaller size than the smallest deflection area of the pattern lithography system, and it is possible to avoid increase of the amount of the lithography pattern data caused by the above described dividing process.

Further, according to the present invention, overlap lithography with shifted deflection boundaries or single lithography with variable size of the deflection area can be carried out.

The entire contents of Japanese Patent Application H10-073888, filed Mar. 23, 1998, is incorporated herein by reference.

What is claimed is:

1. A method of lithographing a pattern represented by pattern data using a deflected beam, comprising:

analyzing the pattern data to determine stripes of the pattern to be successively lithographed; and successively, for each determined stripe:
extracting a part of the pattern data corresponding to the stripe;
dividing the extracted part of the pattern data into sub-patterns whose size is smaller than a minimum deflection range of the beam;
distributing sub-patterns of the extracted part to produce lithography data for driving a lithographing unit to lithograph the stripe; and
lithographing the stripe,
wherein each successive distributing is followed by deleting the sub-patterns after they have been distributed.

2. The method recited in claim 1, wherein the dividing step is preceded by specifying a sub-pattern size.

3. A method of lithographing a pattern represented by pattern data using a deflected beam, comprising:

analyzing the pattern data to determine overlapping stripes of the pattern to be successively lithographed; and successively, for each determined stripe:
extracting a part of the pattern data representing the stripe for which sub-patterns are not already stored;
dividing the extracted part of the pattern data into sub-patterns whose size is smaller than a minimum deflection range of the beam and storing the divided data;
storing the sub-patterns of the extracted part;
distributing stored sub-patterns to produce lithography data for driving a lithographing unit to lithograph the stripe; and
lithographing the stripe,
wherein each successive distributing is followed by deleting any sub-patterns that cannot be used for lithographing a succeeding stripe.

4. A computer readable medium storing control programming code for controlling a general purpose computer of a lithography system to perform a lithography process that lithographs a pattern represented by pattern data by using a deflected beam, the process comprising the steps of:

analyzing the pattern data representing the pattern to be lithographed to determine stripes of the pattern to be successively lithographed; and successively, for each determined stripe:
extracting a part of the pattern data corresponding to the stripe;
dividing the extracted part of the pattern data into sub-patterns whose size is smaller than a minimum deflection range of the beam; and
distributing sub-patterns of the extracted part to produce lithography data for driving a lithographing unit to lithograph the stripe,
wherein each successive distributing is followed by deleting the sub-patterns after they have been distributed.

5. The computer readable medium recited in claim 4, wherein the dividing step in the lithography process is preceded by specifying a sub-pattern size.

6. A computer readable medium storing control programming code for controlling a general purpose computer of a lithography system to perform a lithography process that lithographs a pattern represented by pattern data by using a deflected beam, the process comprising the steps of:

analyzing the pattern data representing the pattern to be lithographed to determine stripes of the pattern to be successively lithographed; and successively, for each determined stripe:
extracting a part of the pattern data representing the stripe for which sub-patterns are not already stored;
dividing the extracted part of the pattern data into sub-patterns whose size is smaller than a minimum deflection range of the beam;
storing the sub-patterns of the extracted part; and
distributing stored sub-patterns to produce lithography data for driving a lithographing unit to lithograph the stripe,
wherein the distributing of the sub-patterns in the lithography process is followed by deleting any sub-patterns that cannot be used for lithographing a succeeding stripe.

* * * * *